United States Patent
Gordin et al.

(10) Patent No.: US 8,041,546 B2
(45) Date of Patent: *Oct. 18, 2011

(54) CAPACITANCE MODELING

(75) Inventors: Rachel Gordin, Hadera (IL); David Goren, Nesher (IL)

(73) Assignee: International Business Machines Corporation, Armonk, NY (US)

( * ) Notice: Subject to any disclaimer, the term of this patent is extended or adjusted under 35 U.S.C. 154(b) by 502 days.

This patent is subject to a terminal disclaimer.

(21) Appl. No.: 12/137,257

(22) Filed: Jun. 11, 2008

(65) Prior Publication Data

US 2008/0243453 A1    Oct. 2, 2008

Related U.S. Application Data

(62) Division of application No. 11/123,806, filed on May 6, 2005, now Pat. No. 7,392,490.

(30) Foreign Application Priority Data

May 7, 2004  (GB) .................................. 0410186.1

(51) Int. Cl.
   *G06F 17/50*  (2006.01)
(52) U.S. Cl. ...................... 703/2; 703/17; 716/4; 716/5
(58) Field of Classification Search .............. 703/2, 5, 703/17; 361/328; 716/5, 7, 4, 11; 438/28
   See application file for complete search history.

(56) References Cited

U.S. PATENT DOCUMENTS

| 5,291,157 | A | | 3/1994 | Riebman |
| 5,786,979 | A | * | 7/1998 | Douglass ....................... 361/328 |
| 6,291,254 | B1 | | 9/2001 | Chou et al. |
| 7,071,889 | B2 | | 7/2006 | McKinzie et al. |
| 7,215,007 | B2 | | 5/2007 | McKinzie et al. |
| 7,392,490 | B2 | * | 6/2008 | Gordin et al. ................. 716/111 |
| 2003/0071763 | A1 | | 4/2003 | McKinzie et al. |
| 2005/0262458 | A1 | * | 11/2005 | Gordin et al. ..................... 716/4 |
| 2008/0244485 | A1 | * | 10/2008 | Gordin et al. ..................... 716/5 |

OTHER PUBLICATIONS

Office Action dated Feb. 9, 2011 from U.S. Appl. No. 12/137,277.

* cited by examiner

*Primary Examiner* — Thai Phan
(74) *Attorney, Agent, or Firm* — Scully, Scott, Murphy & Presser, P.C.; William J. Stock, Esq.

(57) ABSTRACT

A method of modeling capacitance for a structure comprising a pair of long conductors surrounded by a dielectric material and supported by a substrate. In particular, the structure may be on-chip coplanar transmission lines over a conductive substrate operated at very high frequencies, such that the substrate behaves as a perfect dielectric. It is assumed that the surrounding dielectric material is a first dielectric with a first permittivity ($\epsilon_1$) and the substrate is a second dielectric with a second permittivity ($\epsilon_2$). The method models the capacitance ($C_1$) for values of the first and second permittivity ($\epsilon_1$, $\epsilon_2$) based on known capacitance ($C_2$) computed for a basis structure with the same first permittivity ($\epsilon_1$) and a different second permittivity ($\epsilon_2$). Extrapolation or interpolation formulae are suggested to model the sought capacitance ($C_1$) through one or more known capacitances ($C_2$).

20 Claims, 8 Drawing Sheets

CAPACITANCE MODELING

RELATED APPLICATIONS

This application is a divisional of U.S. application Ser. No. 11/123,806, filed May 26, 2005.

TECHNICAL FIELD

The present invention relates to the field of modeling capacitance. In particular, the invention relates to modeling capacitance in integrated circuits; specifically, modeling capacitance of on-chip coplanar transmission lines over a substrate.

BACKGROUND OF THE INVENTION

Models of on-chip coplanar transmission lines over a substrate have been developed as a part of the "T-lines set" which is the core of an interconnect-aware design and modeling methodology, enabling high predictability of the critical interconnect behaviour. Further information is provided in references: Goren, D. et al., "An Interconnect-Aware Methodology for Analog and Mixed Signal Design, Based on High Bandwidth (Over 40 GHz) On-chip Transmission Line Approach" IEEE DATE'02 Conference, Paris March 2002, pp. 804-811 and Goren, D. et al., "On-chip Interconnect-Aware Design and Modeling Methodology, Based on High Bandwidth Transmission Line Devices", IEEE DAC'03 Conference, CA, June 2003, pp. 724-727.

Currently supported production level coplanar transmission lines include single wire and two coupled wires as shown in the cross-sections of FIGS. 1A and 1B. The structures are symmetrical and include grounded side shield lines. The wires are close to each other and "thick" i.e. their width, the metal layer thickness and the gaps between the wires are of the same order. The metal wires are surrounded in cross-section by a surrounding material which is a dielectric, for example, an oxide dielectric. The surrounding material is supported by a substrate, for example, a silicon substrate.

As follows from hardware measurements and numerical studies of wideband behaviour of on-chip coplanar transmission lines over a substrate which is conductive, a line capacitance per unit length strongly decreases with the frequency growth of the current in the wires. Although a lower substrate resistivity causes a slower capacitance decrease, the C(f) curves for different substrate resistance values tend to the same asymptotic values: a low frequency limit $C_0$ and a high frequency limit $C_{2\infty}$.

The surrounding material in which the wires are provided is assumed to be a dielectric which is a perfect insulator. The substrate is a material which has a finite electrical conductivity in addition to dielectric properties.

The permittivity $\epsilon_1$ of the dielectric surrounding material does not depend on frequency, while the permittivity $\epsilon_2$ of a conductive substrate is a complex quantity depending on the frequency f, such that at f=0 and at f=∞ it assumes real values. The substrate acts as a perfect conductor at low frequencies and as an ideal dielectric at very high frequencies. As a result of the frequency dependence of the substrate, the capacitance of the conductors is a function of frequency. A solution for arbitrary real permittivities 61 and 82 includes both $C_0$ and $C_\infty$ as specific cases. Accurate computation of these asymptotical values has critical impact on the accuracy of a transmission line model in the whole bandwidth of interest.

There are several techniques for computing $C_0$ which account for "thick" wires and result in explicit expressions yielding reasonable accuracy. However, the previous approaches to calculating $C_\infty$ either have used purely numeric approach, or have been based on very rough assumptions (such as assuming zero thickness of the wires) leading to large and unpredictable errors.

An Electro-Magnetic (EM) solver provides a numeric solution of Maxwell's equations for certain specific cases, characterized by geometry (2D or 3D) and frequency range (quasi-static or full wave solution method is chosen based on the required frequency range per geometry). The output includes electric and/or magnetic field distributions, and integral parameters (capacitance, inductance, S-parameters, impedance), etc. In any case, for each set of input parameters, the solution process includes a definition of the solution domain, dividing it into a mesh of N elementary cells, building and solving a system of k*N algebraic linear equations, k≧1. N has a variable order of magnitude, $10^2$-$10^6$, depending on geometry and required accuracy.

The advantage of EM solvers is their high accuracy. Their disadvantages are very large computation time and memory usage, and extremely difficult integration with other tools, which prevents their usage in various solution flows/environments, e.g. chip design and simulation flow. Therefore, EM solvers are used mostly as stand-alone tools for verifying or fitting of other solutions which are integrated within the desired design flow or environment.

The aim of the present invention is to yield accurate explicit expressions for high frequency capacitance $C_\infty$ which account for "thick" rectangular wires. In particular, a method of modeling capacitance is provided for a structure such as on-chip coplanar transmission lines over a conductive substrate operated at very high frequencies such that the substrate behaves as a perfect dielectric.

There are specific cases of the relationship between the permittivities $\epsilon_1$ and $\epsilon_2$ of the surrounding material and the substrate in which capacitance is much easier to calculate. The core idea is to calculate the capacitance of a pair of long conductors for certain values of permittivity $\epsilon_1$ and $\epsilon_2$, based on a known capacitance computed for the same value of the permittivity $\epsilon_1$ of the surrounding material and a different value of the permittivity $\epsilon_2$ of the substrate.

The present invention uses the fact that at very high frequencies, the substrate behaves as a dielectric. Therefore, formulae can be suggested for computing the capacitance in the case of two different dielectrics as the surrounding material and the substrate. These formulae can then be used for modeling the desired high frequency capacitance.

The description presents a semi-analytical technique for modeling capacitance of on-chip coplanar transmission lines over a substrate. The focus is put on developing expressions for high frequency capacitance which yield reasonable accuracy. The technique is based on the two-dimensional approach and results in accurate and efficient expressions accounting for frequency dependent behavior of the substrate, as well as for actual transmission lines geometry.

SUMMARY OF THE INVENTION

According to a first aspect of the present invention there is provided a method of modeling capacitance for a subject structure comprising a pair of long conductors surrounded by a dielectric material and supported by a substrate, wherein the capacitance of the conductors is a function of current frequency, the method comprising: assuming the surrounding dielectric material is a first dielectric with a first permittivity ($\epsilon_1$) and the substrate is a second dielectric with a second permittivity ($\epsilon_2$); modeling the capacitance ($C_1$) for values of the first and second permittivity ($\epsilon_1$, $\epsilon_2$) based on known capacitance ($C_2$) computed for a basis structure with the same first permittivity ($\epsilon_1$) and a different second permittivity ($\epsilon_2$).

The known capacitance is preferably computed for a basis structure with the same cross-section geometry as the subject structure.

The surrounding dielectric material is preferably an insulating material and the substrate preferably behaves as a conductor at low frequencies and as a dielectric at very high frequencies. Therefore, in an assumed model, the first permittivity does not depend on frequency and the second permittivity does depend on frequency. This method of modeling capacitance is particularly applicable to modeling high frequency capacitance as a substrate may act as a dielectric at high frequencies.

The capacitance of the subject structure may be modelled from the capacitance of one or more basis structures using an extrapolation or interpolation formula.

The input information for the method may include: the first permittivity $\epsilon_1$ of the first dielectric of both the subject structure and the basis structure, the second permittivity $\epsilon_2$ of the second dielectric of the basis structure, and the cross-sectional geometry of the subject or basis structure. The known capacitance may be provided by one of an Electro-Magnetic solver, an analytical formula, a quasi-analytical formula, and look-up tables.

In an example embodiment, the dielectric is an oxide dielectric and the substrate is a silicon substrate. The pair of long conductors may each have a width and metal layer thickness of the same order. The pair of long conductors may be spaced apart by a distance of the same order as the width and thickness of the conductors. The cross-section of each of the long conductors may be constant along the length. Each of the long conductors may be formed of a single conductor or more than one parallel conductor.

Preferably, the structure comprises on-chip coplanar transmission lines over a conductive substrate.

According to a second aspect of the present invention there is provided a method of modeling capacitance for a subject structure comprising a pair of long conductors surrounded by a dielectric material and supported by a substrate, wherein The capacitance of the conductors is a function of current frequency, wherein the method includes the steps of: assuming the surrounding dielectric material is a first dielectric with a first permittivity ($\epsilon_1$) and the substrate is a second dielectric with a second permittivity ($\epsilon_2$); determining the reflection coefficient for the subject structure and the basis structure based on the first and second permittivities ($\epsilon_1$, $\epsilon_2$); determining the mirror capacitance for the basis structure; and computing the capacitance of the subject structure based on the reflection coefficients and the mirror capacitance.

The mirror capacitance may be computed using the charge density function of the basis structure. Alternatively, the mirror capacitance may be the averaged mirror capacitance based on a uniform charge density approximation for the basis structure.

The method may include the following steps: defining: $C_1$ as the capacitance for the subject structure; $C_2$ as the capacitance for the basis structure; $\epsilon_{21}$ as the substrate permittivity $\epsilon_2$ of the subject structure; and $\epsilon_{22}$ as the substrate permittivity $\epsilon_2$ of the basis structure; determining the reflection coefficient, $k_i=(\epsilon_1-\epsilon_{2i})/(\epsilon_1+\epsilon_{2i})$ for i=1,2; determining if the charge density function $\sigma(X,k_2)$ for the basis solution is available, if it is available, computing the "mirror capacitance" $C^*(k_2)=C^*(X_1,X_2,k_2)$ which is fully defined by $\sigma(X,k_2)$, and if the charge density function for the basis solution is not available, computing the "averaged mirror capacitance" $C^*(k_2)=C^*_{avg}(k_2)$ based on the uniform charge density approximation; and computing the capacitance $C_1$ using the extrapolation formula: $C_1=1/(1/C_2+(k_1-k_2)/C^*(k_2))$.

According to a third aspect of the present invention there is provided an integrated circuit design system comprising means for modeling capacitance for a subject structure comprising a pair of long conductors surrounded by a dielectric material and supported by substrate, assuming the surrounding dielectric material is a first dielectric with a first permittivity ($\epsilon_1$) and the substrate is a second dielectric with a second permittivity ($\epsilon_2$), the system comprising: means for modeling the capacitance ($C_1$) for values of the first and second permittivity ($\epsilon_1$, $\epsilon_2$) based on known capacitance ($C_2$) computed for a basis structure with the same first permittivity ($\epsilon_1$) and a different second permittivity ($\epsilon_2$).

According to a fourth aspect of the present invention there is provided an integrated circuit design system comprising means for modeling capacitance for a subject structure comprising a pair of long conductors surrounded by a dielectric material and supported by substrate, assuming the surrounding dielectric material is a first dielectric with a first permittivity ($\epsilon_1$) and the substrate is a second dielectric with a second permittivity ($\epsilon_2$), the system comprising: means for determining the reflection coefficient for the subject structure and a basis structure based on the first and second permittivities ($\epsilon_1$, $\epsilon_2$) of the subject structure and the basis structure; means for determining the mirror capacitance for the basis structure; and means for computing the capacitance of the subject structure based on the reflection coefficients and the mirror capacitance.

The integrated circuit design system may comprise: means for determining the reflection coefficient, $k_i=(\epsilon_1-\epsilon_{2i})/(\epsilon_1+\epsilon_{2i})$ for i=1,2; means for determining if the charge density function $\sigma(X,k_2)$ for the basis solution is available, if it is available, means for computing the "mirror capacitance" $C^*(k_2)=C^*(X_1,X_2,k_2)$ which is fully defined by $\sigma(X,k_2)$, and if the charge density function for the basis solution is not available, means for computing the "averaged mirror capacitance" $C^*(k_2)=C^*_{avg}(k_2)$ based on the uniform charge density approximation; and means for computing the capacitance $C_1$ using the extrapolation formula: $C_1=1/(1/C_2+(k_1-k_2)/C^*(k_2))$; wherein $C_1$ is the capacitance for the subject structure; $C_2$ is the capacitance for the basis structure; $\epsilon_{21}$ is the substrate permittivity $\epsilon_2$ of the subject structure; and $\epsilon_{22}$ is the substrate permittivity $\epsilon_2$ of the basis structure.

According to the fifth aspect of the present invention there is provided a computer program product stored on a computer readable storage medium, comprising computer readable program code means for modeling capacitance for a subject structure comprising a pair of long conductors surrounded by a dielectric material and supported by a substrate, assuming the surrounding dielectric material is a first dielectric with a first permittivity ($\epsilon_1$) and the substrate is a second dielectric with a second permittivity ($\epsilon_2$), comprising code means for performing the modeling the capacitance ($C_1$) for values of the first and second permittivity ($\epsilon_1$, $\epsilon_2$) based on known capacitance ($C_2$) computed for a basis structure with the same first permittivity ($\epsilon_1$) and a different second permittivity ($\epsilon_2$).

According to a sixth aspect of the present invention there is provided a computer program product stored on a computer readable storage medium, comprising computer readable program code means for modeling capacitance for a subject structure comprising a pair of long conductors surrounded by a dielectric material and supported by a substrate, assuming the surrounding dielectric material is a first dielectric with a first permittivity ($\epsilon_1$) and the substrate is a second dielectric with a second permittivity ($\epsilon_2$), comprising code means for performing the steps of: determining the reflection coefficient for the subject structure and the basis structure based on the first and second permittivities ($\epsilon_1$, $\epsilon_2$); determining the mirror capacitance for the basis structure; and computing the capacitance of the subject structure based on the reflection coefficients and the mirror capacitance.

The computer program product may comprise computer readable program code means for performing the steps of: determining the reflection coefficient, $k_i=(\epsilon_1-\epsilon_{2i})/(\epsilon_1+\epsilon_{2i})$ for i=1,2; determining if the charge density function $\sigma(X,k_2)$ for the basis solution is available if it is available, computing the "mirror capacitance" $C^*(k_2)=C^*(X_1,X_2,k_2)$ which is fully defined by $\sigma(X,k_2)$, and if the charge density function for the basis solution is not available, computing the "averaged mirror capacitance" $C^*(k_2)=C^*_{avg}(k_2)$ based on the uniform charge density approximation; and computing the capacitance $C_1$ using the extrapolation formula: $C_1=1/(1/C_2+(k_1-k_2)/C^*(k_2))$; wherein $C_1$ is the capacitance for the subject structure; $C_2$ is the capacitance for the basis structure; $\epsilon_{21}$ is the substrate permittivity $\epsilon_2$ of the subject structure; and $\epsilon_{22}$ is the substrate permittivity $\epsilon_2$ of the basis structure.

DESCRIPTION OF PREFERRED EMBODIMENTS

Embodiments of the present invention will now be described, by way of examples only, with reference to the accompanying drawings in which.

Figure 1A:
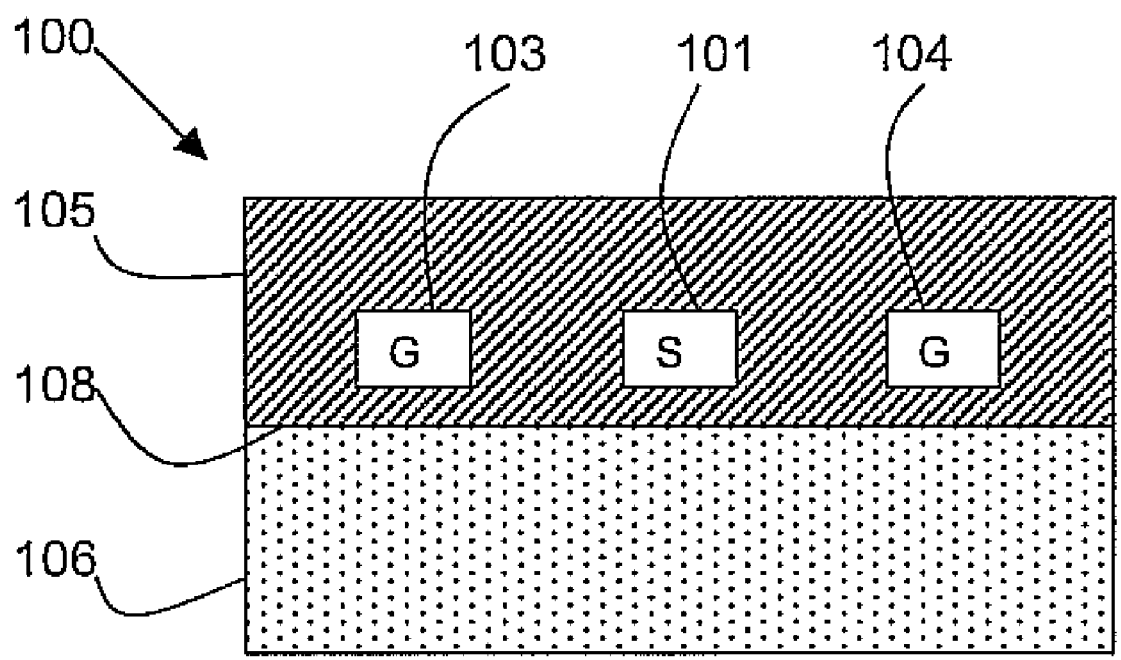
FIGS. 1A and 1B are cross-sections of coplanar transmission lines as known in the prior art.
Figure 1B:
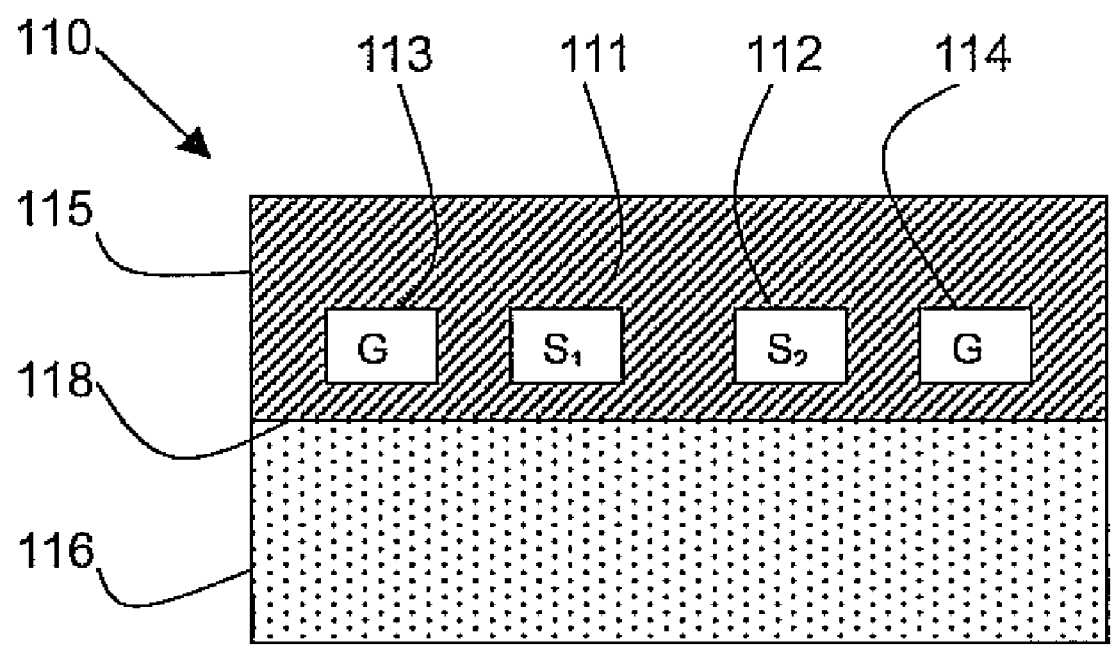

FIGS. 1A and 1B show the cross-sections of currently supported production level coplanar transmission lines. FIG. 1A shows a first example 100 with a single wire 101. FIG. 1B shows a second example with two coupled wires 111, 112. The structures are symmetrical and include grounded side shield lines 103, 104, 113, 114.

The signal wires 101, 111, 112, and the grounded side shield lines 103, 104, 113, 114 are supported in a surrounding material 105, 115 which is a dielectric, for example, an oxide dielectric, and are based on a substrate 106, 116, for example, a silicon substrate.

The wires are "thick" i.e. their width and the metal layer thickness are of the same order The transmission line structures are "long" in a sense that they are featured by a small ratio of cross-section characteristic dimension versus wire length, usually less than 2%.

For such structures, calculation of all electric characteristics can be performed per unit length using a two-dimensional approach. A line capacitance per unit length of on-chip coplanar transmission lines over a conductive substrate strongly decreases with the frequency growth. This is known from hardware measurements and numerical studies of wideband behavior. Although a lower substrate resistivity causes a slower capacitance decrease, the C(f) curves for different substrate resistance values tend to the same asymptotic values: the low frequency limit $C_0$ and the high frequency limit $C_\infty$. Accurate computation of these asymptotical values has critical impact on the accuracy of a transmission line model in the whole bandwidth of interest. There are several techniques for computing the low frequency limit of capacitance $C_0$ which account for "thick" wires and result in explicit expressions yielding reasonable accuracy. This description focuses on developing accurate explicit expressions for the high frequency limit of capacitance $C_\infty$ which account for "thick" wires.

A pair of long conductors is considered located in a uniform lossless dielectric over a conductive substrate. The conductors do not touch the planar boundary 108, 118 between the dielectric and the substrate. It is assumed that the substrate is "grounded at infinity", namely that far away from the conductors the potential of the substrate is zero. This condition is what is provided in practical designs, assuming the mandatory existence of substrate ground contacts, though in many practical cases there is no back ground metallization contact to the substrate.

The conductors' cross-sections can be of any shape, provided that it is constant along the wires, in particular, each conductor may be composed of several parallel wires.

The transmission line structures shown in FIGS. 1A and 1B are considered as examples. In case of a single coplanar transmission line 100 as shown in FIG. 1A, a pair of long conductors is provided in which the first conductor is the signal wire S 101 and the second conductor is the union of the side shield wires G 103, 104. Referring to FIG. 1B, for coupled coplanar transmission line operated in common mode, a pair of long conductors is provided in which the first conductor is the union of signal wires $S_1$ 111 and $S_2$ 112 and the second conductor is the union of two side shield wires G 113, 114. While in single mode, the first conductor is one of the signal wires 111, 112, and the second conductor is the union of another signal wire 112, 111 and both side shield wires 113, 114.

Both the surrounding dielectric material and the substrate should be spatially uniform i.e. both the permittivity $\epsilon_1$ of the surrounding dielectric material and the permittivity $\epsilon_2$ of the substrate do not depend on coordinates. The permittivity $\epsilon_1$ of the surrounding material does not depend on frequency. However, the permittivity $\epsilon_2$ of the substrate does depend on frequency f, such that at low frequencies the substrate behaves as a perfect conductor: $\epsilon_2(f=0)\to\infty$, and at very high frequencies—as an ideal dielectric: $\infty>\epsilon_2(f\to\infty)\geq\epsilon_1$. This frequency dependence of $\epsilon_2$ usually follows from the substrate having a finite electrical conductivity in addition to its dielectric properties. However, the surrounding dielectric material is assumed to be a perfect insulator.

In an example embodiment, the surrounding dielectric material may be an oxide dielectric such as silicon oxide which is a good example for such a practically zero conductivity material to be used as the dielectric. The conductive substrate may be, for example, a silicon substrate.

As stated above, the permittivity $\epsilon_1$ of the surrounding dielectric material does not depend on frequency, while the permittivity $\epsilon_2(f)$ of the substrate is a complex quantity depending on the frequency f, such that at f=0 and at $f\to\infty$ it assumes real values:

$$\epsilon_1<\epsilon_2=\epsilon_2(f\to\infty)<\epsilon_2(f=0)\to\infty$$

In case of silicon oxide dielectric over silicon substrate, $\epsilon_1\approx 4$, $\epsilon_2(f\to\infty)\approx 12$.

Thus, at low frequencies the substrate behaves as a perfect conductor, and at very high frequencies—as an ideal dielectric. As a result, the capacitance of the conductors is a function of frequency. Both asymptotic values of the capacitance, $C_0$ and $C_\infty$, can be calculated assuming that the electric charge is distributed on the surface of the wires, i.e. using an electrostatic approach.

The transition from "conducting behaviour" to "dielectric behaviour" can be estimated by a transition frequency usually referred to as "relaxation frequency".

$$\text{freq1}=1/(2\pi\epsilon_0\epsilon_{sub}\rho_{sub})$$

where $\rho_{sub}$ is the resistivity of the substrate (typically 1 to 15 Ohm cm);

$\epsilon_{sub}$ is the relative permittivity of the substrate (for silicon, $\epsilon_{sub}=11.9$);

$\epsilon_0$ is the permittivity of a vacuum.

For example, for CMOS, $\rho_{sub}=1$-2 Ohm cm which gives a relaxation frequency, freq1 in the order of 100 GHz, for SOI and SiGe, $\rho_{sub}=10$-15 Ohm cm which gives a relaxation frequency, freq1 in the order of 10 GHz.

The goal of the described method is to evaluate the capacitance for arbitrary real $\epsilon_1 \leq \epsilon_2$ which includes both $C_0$ and $C_\infty$ as specific cases. A two-dimensional approach is used, i.e. all the electric field characteristics refer to an arbitrary cross-section of the structure which is perpendicular to the conductors' length.

In this approach, as the substrate behaves as a dielectric at very high frequencies, the surrounding material and the substrate are modelled as two different dielectrics, a first dielectric with permittivity $\epsilon_1$ and a second dielectric with permittivity $\epsilon_2$.

Figure 2A:
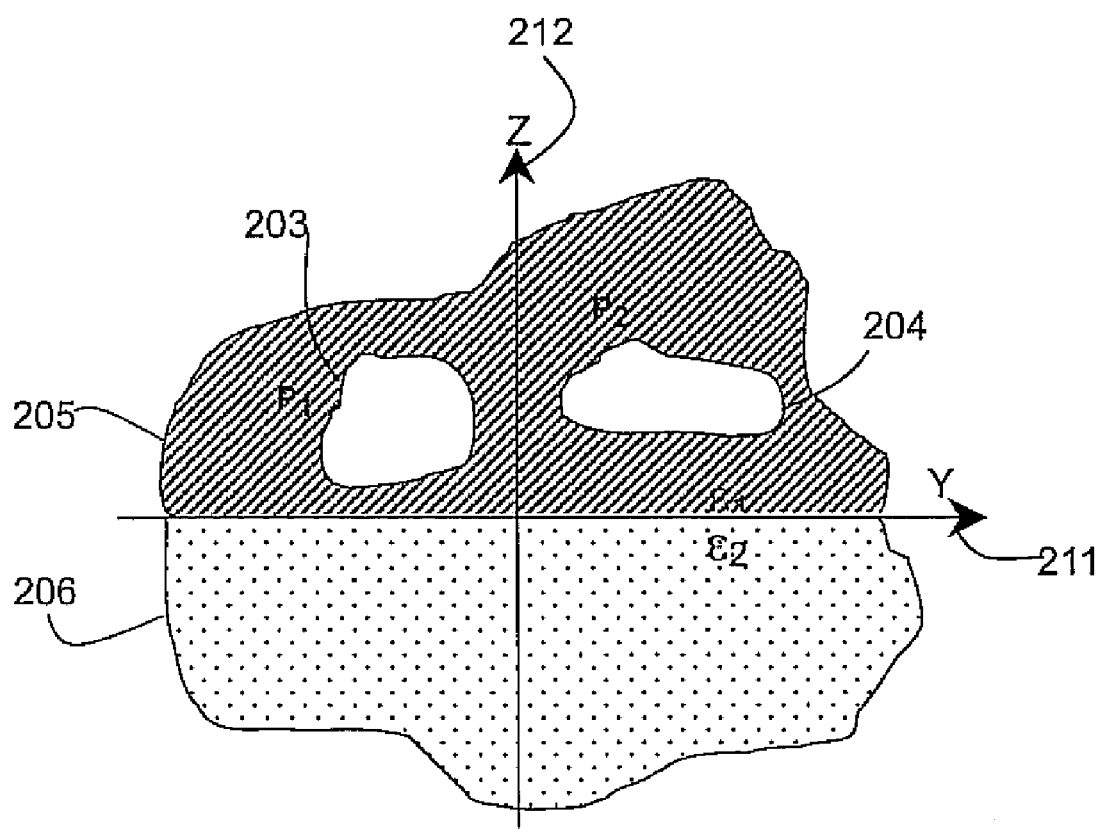
FIGS. 2A and 2B are cross-sections of a structure defining a coordinate system in accordance with the present application.

In an arbitrary cross-section plane, a coordinate system YZ is introduced as shown in FIG. 2A. A cross-section 200 of a structure is shown. The structure is formed of a first dielectric $\epsilon_1$ 205 and second dielectric $\epsilon_2$ 206 with a pair of long conductors in the form of wires P1 203 and P2 204 disposed in the first dielectric $\epsilon_1$ 205. An axis Y 211 is defined lying within the planar $\epsilon_1/\epsilon_2$ boundary 202 between the first dielectric $\epsilon_1$ 205 and the second dielectric $\epsilon_2$ 206. An axis Z 212 is defined perpendicular to the boundary 202. The origin of the coordinate system is chosen to simplify the calculations.

The calculations of the described method are presented in three stages.

1. Derive the electrostatic potential $\phi$ induced by an infinitely thin and long charged wire located in the half-space filled with dielectric $\epsilon_1$ (further referred to as "upper half-space") near the planar boundary with the half-space filled with dielectric $\epsilon_2 \geq \epsilon_1$ ("lower half-space").

2. Derive the electrostatic potentials $V_1$ and $V_2$ of two arbitrarily shaped infinitely long conductors bearing charge Q and $-Q$ per unit length.

3. The capacitance per unit length is $C=Q/|V_1-V_2|$.

Stage 1—Electrostatic potential induced by a thin charged wire parallel to a planar boundary between two dielectrics.

Figure 2B:
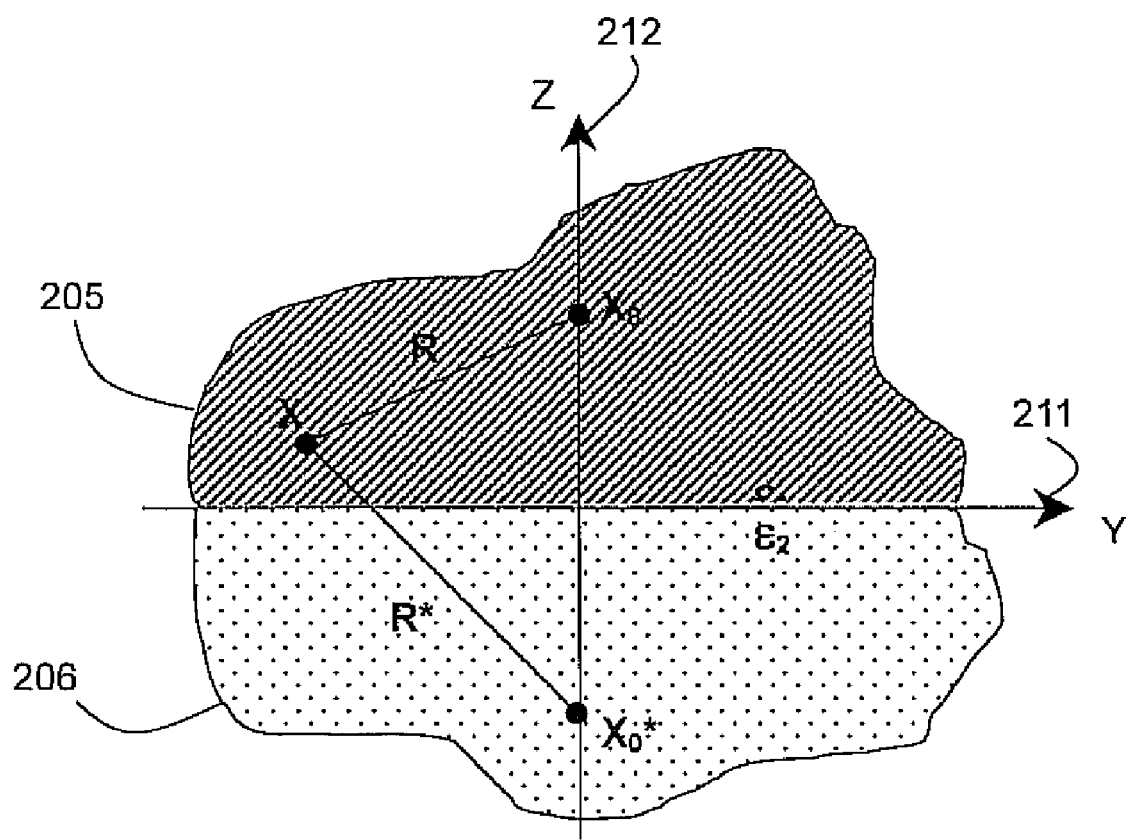

Denote by $\sigma$ the wire charge per unit length, and by $\phi_1$, $\phi_2$ potential in the dielectrics $\epsilon_1$ and $\epsilon_2$, respectively. Specify the origin of the coordinate system YZ on the $\epsilon_1/\epsilon_2$ boundary exactly below the wire, so that the axis Z crosses the wire at the point $X_0(y=0, z=z_0)$ as shown in FIG. 2B.

Within each of the dielectrics, $\epsilon_1$ and $\epsilon_2$ satisfy the Poisson equation $$\nabla^2\phi_i=\sigma_i/\epsilon_i, i=1,2. \quad (1)$$

$\sigma_1$, $\sigma_2$ are charge densities in the dielectrics $\epsilon_1$, $\epsilon_2$, defined as $\sigma_1=\sigma^*\delta(X-X_0)$ where $\delta(X-X_0)$ is the 2-D Dirac delta-function, and $\sigma_2=0$. Therefore, in the infinitely close vicinity of the point $X_0$, the potential is 0

$$\phi_1^0=\sigma/(2\pi\epsilon_1)\ln(R_0/R)$$

where R is the distance between the point $X_0$ and an arbitrary point X close to $X_0$, $R_0$ is an arbitrary constant distance. The potentials $\phi_1$, $\phi_2$ can be expressed as follows:

$$\phi_1=\phi_1^0+\phi_1^*, \nabla^2\phi_1^*=0, \quad (2)$$

$$\nabla^2\phi_2=0,$$

the functions $\phi_1^*$ and $\phi_2$ having no singularities in respective domains.

The potential in any cross-section point X is a function of only two independent distances: the distance R between X and $X_0$, and the distance z between X and the $\epsilon_1/\epsilon_2$ boundary. For the sake of symmetry, instead of z, R* is used—the distance between X and $X_0^*$ $(y=0, z=-z_0)$, which is symmetrical to $X_0$ relative to the $\epsilon_1/\epsilon_2$ boundary (see FIG. 2B).

On the planar $\epsilon_1/\epsilon_2$ boundary $(z=0, or R=R^*)$, the potential should meet the following boundary conditions:

$$\phi_1=\phi_2,$$

$$\epsilon_1\partial\phi_1/\partial z=\epsilon_2\partial\phi_2/\partial z. \quad (3)$$

The potential in the dielectrics $\epsilon_1$ and $\epsilon_2$ which satisfies both the Equation 1 and the boundary conditions Equation 3, is $$\phi=\phi_1 \text{ for } z>0, \phi=\phi_2 \text{ for } z<0,$$

$$\phi_1=\sigma/(2\pi\epsilon_1)(\ln(R_0/R)+k\ln(R_0/R^*)),$$

$$\phi_2=\sigma/(2\pi\epsilon_2)(1-k)\ln(R_0/R), \quad (4)$$

where $$k=(\epsilon_1-\epsilon_2)/(\epsilon_1+\epsilon_2),$$

$$R=\sqrt{(y^2+(z-z_0)^2)}, R^*=\sqrt{(y^2+(z+z_0)^2)}.$$

In order to compute capacitance of the wires located in the upper half-space, only the potential $\phi_1$ is needed. As can be seen from Equation 4, $\phi_1$ will not change if the dielectric $\epsilon_2$ in the low half-space is replaced by $\epsilon_1$, and a second wire bearing charge $k\sigma$ per unit length is inserted, which is the mirror image of the initial wire in the planar $\epsilon_1/\epsilon_2$ boundary. (It should be noted that the described operation changes the potential in the lower half-space.)

The important specific cases of the solution given by Equation 4 are:

$k=0 \Rightarrow \epsilon_1=\epsilon_2$—the wire is located in the space filled with uniform dielectric $\epsilon_1$.

$k=1 \Rightarrow \epsilon_2 \to \infty$—the wire is located in the upper half-space filled with dielectric $\epsilon_1$, while the lower half-space is filled with perfect conductor. This case corresponds to the behaviour of the substrate at the low frequency limit.

For the high frequency limit, $\epsilon_1 < \epsilon_2 < \infty \Rightarrow -1 < k < 0$.

Stage 2—Electrostatic potential induced by two infinitely long oppositely charged conductors parallel to a planar boundary between different dielectrics.

Consider a pair of long conductors located in the upper half-space filled with dielectric $\epsilon_1$. Let $\epsilon_{21}$ and $\epsilon_{22}$ be different values of $\epsilon_2$, $k_1=k(\epsilon_{21})$, $k_2=k(\epsilon_{22})$, hence, $0 \geq k_1, k_2 \geq -1$. For any physical characteristic $F(x, k)$ defined on surface of the conductors, the following notations will be used $(i=1,2)$:

$$\delta F(x,k_1,k_2)=F(x,k_1)-F(x,k_2),$$

$$F(x,k)=F_i(x,k) \text{ for } x \in P_i,$$

$$\Delta F(x_1,x_2,k)=F_1(x_1,k)-F_2(x_2,k), x_1 \in P_i,$$

$$\Delta F(k)=F_1(k)-F_2(k), \text{ if } F_i(x,k)=F_i(k) \text{ for } x \in P_i.$$

Denote the conductors' cross-section contours by $P_1$ and $P_2$, the perimeter lengths by $p_1$ and $p_2$, and the conductors' surface charge density by $\sigma(x)$, so that $\sigma(x)=\sigma_i(x)$ for $x \in P_i$. The charges of the conductors per unit length are $$Q_1 = Q > 0; Q_2 = -Q;$$  (5)

$$Q_i = \int_{P_i} \sigma(x) dP(x), i = 1,2.$$

The potential induced by the pair of conductors at a point X located in the upper half-space is $$V(X) = 1/(2\pi\varepsilon_1) \int_{P_1 \cup P_2} \sigma(x)\varphi_1(X, x) dP(x)$$ (6)

$$= -1/(2\pi\varepsilon_1) \int_{P_1 \cup P_2} \sigma(x)(\ln(R(X, x)/R_0) + k\ln(R(X, x^*)/R_0)) dP(x)$$

where the point $x \in P_1 \cup P_2$, $x^*$ is the mirror image of the point x in the $\varepsilon_1/\varepsilon_2$ boundary.

Stage 3—Capacitance per unit length of two arbitrarily shaped oppositely charged conductors parallel to a planar boundary between different dielectrics.

Consider $\varepsilon_1$ as a constant, and $\varepsilon_2$ decreasing from $\infty$ to $\varepsilon_1$ i.e. $k=k(\varepsilon_2)$ increasing from $-1$ to $0$, which covers our cases of interest. Then, potential in the upper half-space induced by the pair of conductors with the surface charge density $\sigma(x, k)$ is a function of parameter k.

A relationship between $C(k_1)$ and $C(k_2)$ is sought where $k_1=k(\varepsilon_{21}), k_2=k(\varepsilon_{22}), \varepsilon_{21}$ and $\varepsilon_{22}$ are different values of $\varepsilon_2$. An increase of dielectric permittivity in any part of the space causes increase of the capacitance, hence, $$k_1 \geq k_2 \Rightarrow \varepsilon_{21} \leq \varepsilon_{22} \Rightarrow C(k_1) \leq C(k_2).$$

The difference between the values of potential at the point X, $\delta V(X, k_1, k_2)$, depends on parameters $k_1, k_2$, explicitly, and also implicitly, as a function of difference between respective charge densities, $\delta\sigma(x, k_1, k_2)$:

$$\delta V(X, k_1, k_2) = V(X, k_1) - V(X, k_2)$$ (7)
$$= (k_1 - k_2)V^*(X, k_2) + V^\delta(X, k_1, \delta\sigma(X, k_1, k_2)),$$

$$V^*(X, k_2) = -1/(2\pi\varepsilon_1) \int_{P_1 \cup P_2} \sigma(x, k_2)\ln(R(X, x^*)/R_0) dP(x),$$ (8)

$$V^\delta(X, k_1, \delta\sigma(X, k_1, k_2)) = -1/(2\pi\varepsilon_1)$$ (9)

$$\int_{P_1 \cup P_2} \delta\sigma(x, k_1, k_2)(\ln(R(X, x)/R_0) + k_1\ln(R(X, x^*)/R_0)) dP(x).$$

Consider potential difference between the two conductors for $k=k_1$, $\Delta V(k_1)$. Since the potential on the surface of each conductor is constant, $\Delta V(k_1)$ can be measured between any pair of points $X_1 \in P_1$ and $X_2 \in P_2$, $$\Delta V(k_1) = \Delta V(X_1, X_2, k_1).$$

It follows from Equation 5 that $\Delta V(k_1) > 0$. Using the Equations 7-9, $\Delta V(k_1)$ can be represented in the form $$\Delta V(k_1) = \Delta V(k_2) + (k_1 - k_2)\Delta V^*(X_1, X_2, k_2) + \Delta V^\delta(X_1, X_2, k_1, \delta\sigma).$$ (10)

Note that the charge Q of conductors per unit length does not depend on k. Hence, for any pair of values $k_1, k_2$, $$\int_{P_i} \delta\sigma(p, k_1, k_2) dP(x) = 0, i = 1,2.$$ (11)

Dividing Equation 10 by Q, gets $$1/C(k_1) = 1/C(k_2) + (k_1 - k_2)/C^*(X_1, X_2, k_2) + 1/C^\delta,$$ (12)

where $$1/C(k_i) = \Delta V(k_i)/Q,$$

$$1/C^*(X_1, X_2, k_2) = \Delta V^*(X_1, X_2, k_2)/Q,$$

$$1/C^\delta = 1/C^\delta(X_1, X_2, k_1, \delta\sigma) = \Delta V^\delta(X_1, X_2, k_1, \delta\sigma)/Q.$$

The term $C^*(X_1, X_2, k_2)$ which is referred to as "mirror capacitance" depends on the charge density function $\sigma(x, k_2)$. Once this function is known, both $C(k_2)$ and $C^*(X_1, X_2, k_2)$ can be calculated.

An analysis of the term $1/C^\delta$ yields the following estimation:

$$|1/C^\delta(X_1, X_2, k_1, \delta\sigma)| < 1/(2\pi\varepsilon_1)\alpha(G + |k_1|2A).$$

The term A depends on the conductors' cross-sections shape and on their location relative to the $\varepsilon_1/\varepsilon_2$ boundary, $$A \sim \ln((z^2_{max} + y^2_{max})^{1/2}/z_{min}),$$

$z_{min}$ and $z_{max}$ are the minimal and maximal vertical distance between the conductors' cross-sections contours and the $\varepsilon_1/\varepsilon_2$ boundary, $2^*y_{max}$ is the maximal horizontal distance between the points on the conductors cross-sections contours. The wires do not touch the planar $\varepsilon_1/\varepsilon_2$ boundary, so $z_{min} > 0$. The term G depends on the conductors' cross-sections shape and location of the points $X_1, X_2$, but does not depend on their location relative to the $\varepsilon_1/\varepsilon_2$ boundary (one can try to find location of $X_1, X_2$ so that to minimize G). The term $\alpha$ is a maximum relative difference between the conductors' surface charge densities corresponding to different permittivity values of the lower half-space:

$$\alpha = \max(\alpha_1, \alpha_2),$$

$$\alpha_i = (\delta\sigma_i)_{max}/(Q/p_i), i=1,2.$$

Dependence of the conductors' capacitance on their surface charge density deviations is weak, if they satisfy Equation 5. The smaller is the difference between $k_2$ and $k_1$, the smaller is $\alpha$ and, consequently, $1/C^\delta$. The computations show that even for $k_1=-0.5, k_2=-1$, this term is relatively small.

The usefulness of Equation 12 lies in the fact that it enables the calculation of capacitance $C(k_1)$ of a pair of long conductors for certain values of permittivity $\varepsilon_1$ and $\varepsilon_2$, based on a known capacitance $C(k_2)$ computed for the same value of $\varepsilon_1$ and a different value of $\varepsilon_2$.

Consider two important cases when $C(k_2)$ is much easier to calculate. Using Equation 12 with $k_1=k_2, k_1=0, C(k)$ is presented as a deviation from $C(-1)$—capacitance in case of the whole space filled with dielectric $\varepsilon_1$, $$1/C(k) \approx 1/C(0) + k/C^*(X_1, X_2, 0),$$

$$1/C(k) < 1/C(0).$$ (13)

Similarly, using $k_1=k, k_2=-1, C(k)$ is presented as a deviation from $C(-1)$ which is equal to $C_0$—capacitance in case of the lower half-space filled with perfect conductor, $$1/C(k) \approx 1/C(-1) + (k+1)/C^*(X_1, X_2, -1),$$

$$1/C(k) > 1/C(-1).$$ (14)

If $-0.5<k<0$, then Equation 13 is more accurate; if $-1<k<-0.5$, then Equation 14 yields better accuracy. The worst case is $k=-0.5$. Note that for silicon oxide dielectric over silicon substrate $k \approx 0.5$.

Equation 12 is useful when the charge density function $\sigma(x,k_2)$ is known. However, there are methods that yield $C(k_2)$ in the form from which deriving $\sigma(x,k_2)$ is impossible. An equation similar to Equation 12 is developed which does not require $\sigma(x,k_2)$ to be known.

On the surface of each conductor, potential should be constant, so it can be expressed as its average taken along the cross-section contour:

$$V_i(k) = V_{avg_i}(k) = -1/(2\pi\varepsilon_1 p_i)\int_{P_i} V(X,k) dP(X), i=1,2.$$

The above equation is exact if $V(X,k)$ is the physical potential function. If $V(X,k)$ is an approximate solution, this equation can be used as a condition which this solution should satisfy.

Similarly, define $V^*_{avg}(k_2)$ and $V^\delta_{avg}(k_1,\delta\sigma)$. Eventually, this presentation leads to an equation similar to Equation 12, $$1/C(k_1)=1/C(k_2)+(k_1-k_2)/C^*_{avg}(k_2)+1/C^\delta_{avg}, \quad (15)$$

where $C(k_1)$ and $C(k_2)$ have the same meaning as in Equation 12, $$1/C^*_{avg}(k_2)=\Delta V^*_{avg}(k_2)/Q,$$

$$1/C^\delta_{avg}=1/C^\delta_{avg}(k_1,\delta\sigma)=\Delta V^\delta_{avg}(k_1,\delta\sigma)/Q.$$

The term $1/C^\delta_{avg}(k_1,\delta\sigma)$ is small relative to the inverse "averaged mirror capacitance" $1/C^*_{avg}(k_2)$, which depends on the charge density $\sigma(x,k_2)$, but the dependence is fairly weak, provided that Equation 5 is satisfied. So, $1/C^*_{avg}(k_2)$ is evaluated using uniform charge density approximation, $$\sigma_1(k)=Q/p_1, \sigma_2(x)=-Q/p_2, \quad (16)$$

which yields $$1/C^*_{avg}=1/(2\pi\varepsilon_1)\ln(g^{*2}_{12}/(g^*_{11}g^*_{22})). \quad (17)$$

Here, $g_{ij}$ is the average geometrical distance (AGD) between the contours of i-th and j-th conductors, $$\ln(g_{ij}) = \ln(g(P_i,P_j)) \quad (18)$$
$$= \frac{1}{p_i p_j}\int_{P_i} dP'(X)\int_{P_j}\ln(R(X,x)/R_0) dP(x),$$

$$g^*_{ij} = g(P_i,P^*_j) = g(P^*_i,P_j), i,j=1,2.$$

$P_i^*$ denotes the mirror image of $P_i$ in the $\varepsilon_1/\varepsilon_2$ boundary.

The cross-sections of on-chip coplanar transmission lines as shown in FIGS. 1A and 1B are rectangular, so the right side of Equation 17 is the sum of AGD's between parallel and perpendicular straight line segments, for which simple explicit expressions have been developed.

Table 1 compares the values of high frequency capacitance computed using the presented methodology with the results obtained by two-dimensional Ansoft static EM solver (EM2D), for several typical coplanar transmission line structures. In order to get the upper boundary of the error, the case of $k_1=-0.5$, $k_2=-1$ is studied. The capacitance $C_\infty=C(-0.5)$ obtained by the solver is compared with its approximation by Equation 15, while using the solver for $C_0=C(-1)$ and Equation 17 for $C^*_{avg}$.

TABLE 1

| Coplanar T-line type (FIGS. 1A & 1B) | Single | | Coupled | | | |
|---|---|---|---|---|---|---|
| Signal width, um | 9.0 | 1.0 | 0.70 | | 0.20 | |
| Shield width, um | 9.0 | 0.20 | 0.40 | | 0.30 | |
| Signal-to-shield, um | 6.0 | 8.0 | 4.0 | | 8.0 | |
| Metal thickness, um | 0.29 | 0.32 | 0.55 | | 0.32 | |
| Metal-to-substrate, um | 0.46 | 1.1 | 2.1 | | 1.1 | |
| Signal-to-signal, um | — | — | 1.2 | | 3.0 | |
| Operation mode | — | — | Common | Single | Common | Single |
| C(−1), pF/m(solver) | 569 | 72.3 | 87.2 | 97.0 | 83.3 | 68.6 |
| C(−0.5), pF/m(solver) | 167 | 57.1 | 81.5 | 94.4 | 64.7 | 59.4 |
| C(−0.5), pF/m(model) | 157 | 57.7 | 81.5 | 92.9 | 65.1 | 59.0 |
| Relative error for C(−0.5), model vs. solver | −5.5% | 1.1% | 0.02% | −1.6% | 0.6% | −0.8% |

The steps involved in implementing the method of capacitance modeling using the computations detailed above are now described. The aim is to provide a method to calculate the capacitance of a certain two-dimensional structure for specific values of permittivity of the surrounding dielectric material $\varepsilon_1$ and the substrate $\varepsilon_2$. The method uses extrapolation or interpolation formulae which yield the required solution (referred to as the subject solution) using solutions already computed for the same cross-section geometry with the same value of permittivity of the dielectric $\varepsilon_1$ and different value(s) of the permittivity of the substrate $\varepsilon_2$ (referred to as the basis solution(s)).

The input information needed for the method of modeling capacitance includes: the permittivity of the surrounding dielectric material $\varepsilon_1$, the permittivity of the substrate $\varepsilon_2$ of the basis solution(s), and the cross-sectional geometry of the structure. Optionally, the charge density function for the basis solution may be used.

Figure 3A:
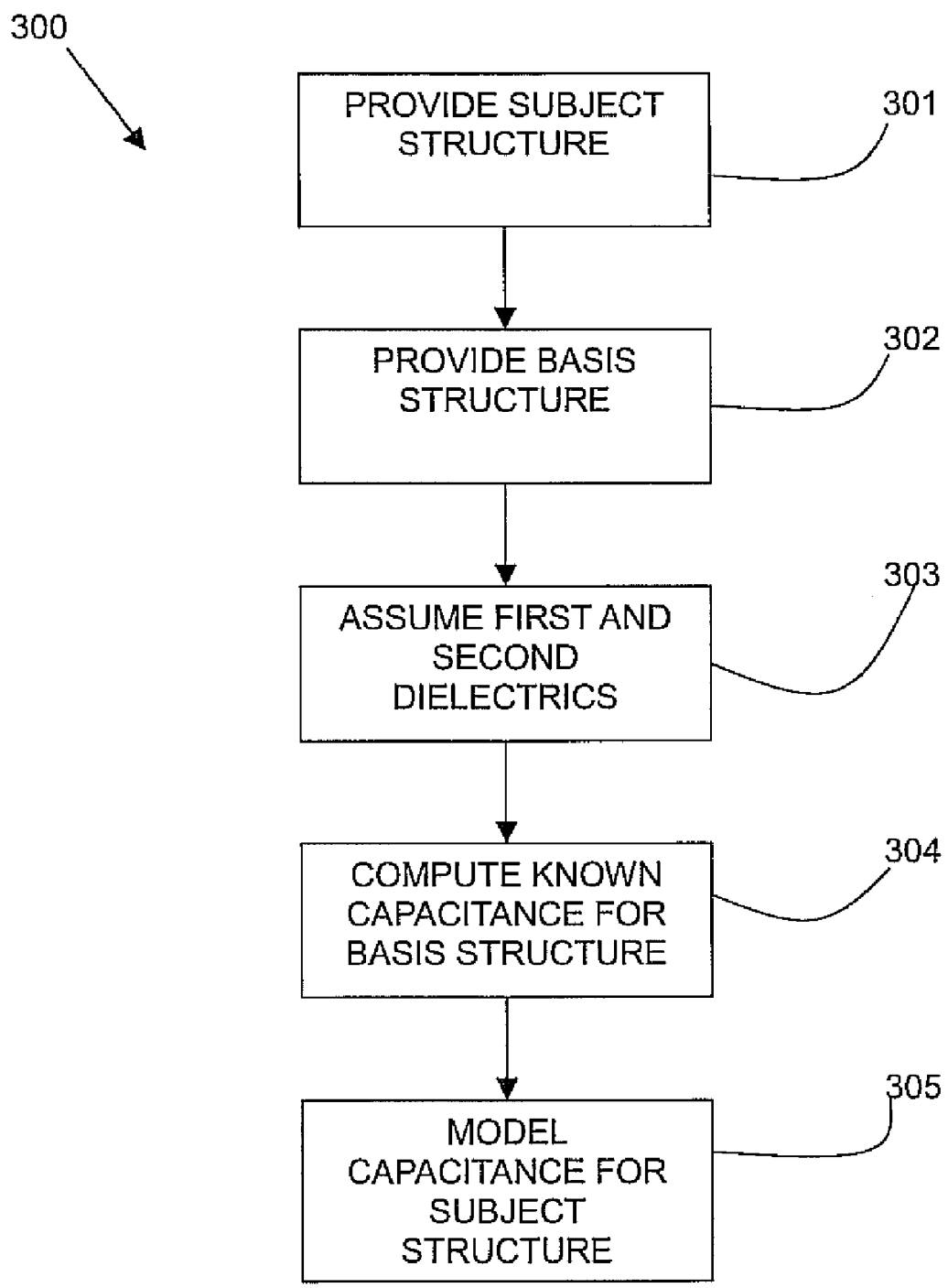
FIGS. 3A to 3C are flow diagrams showing the steps of modeling capacitance in accordance with the present invention.
Figure 3B:
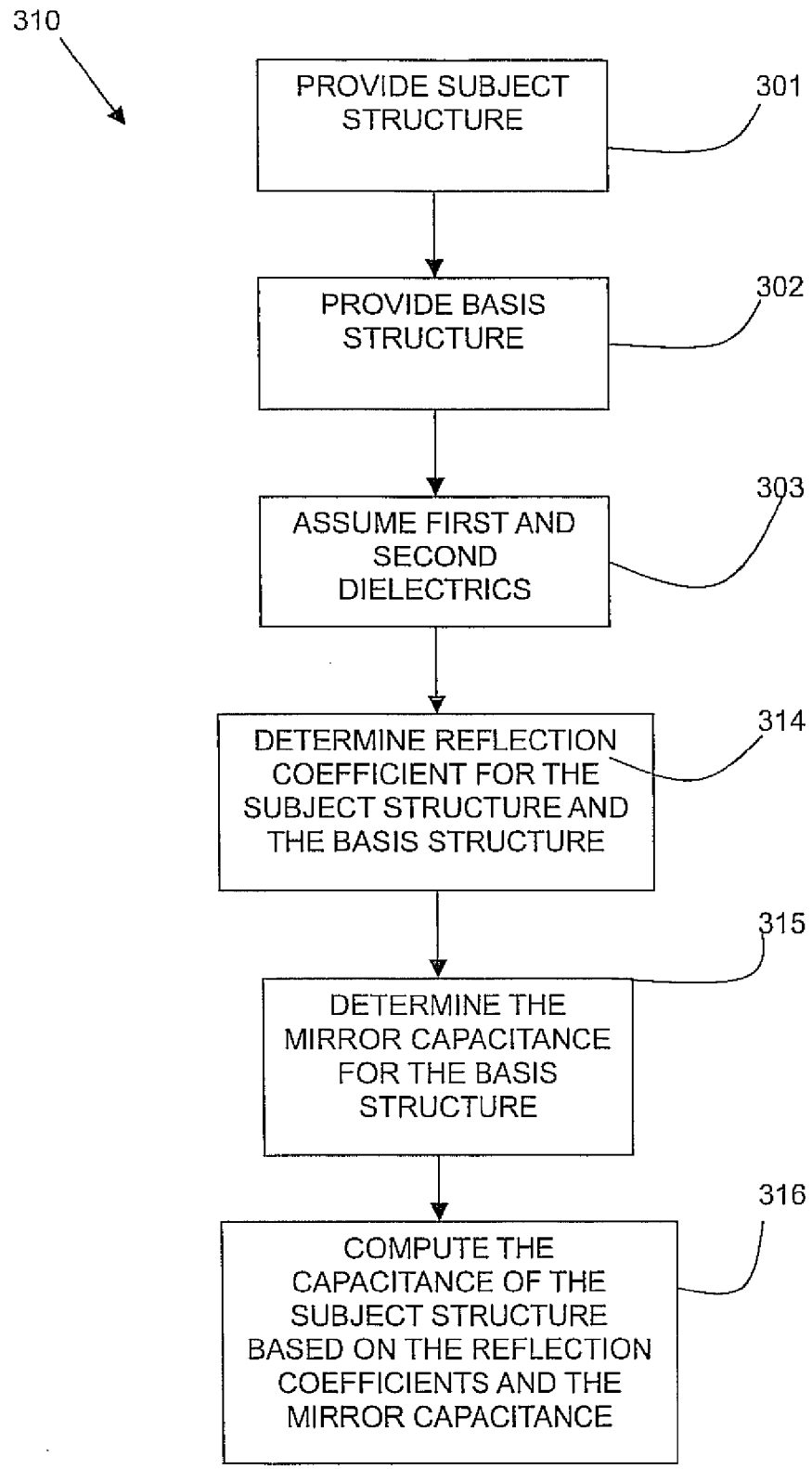
Figure 3C:
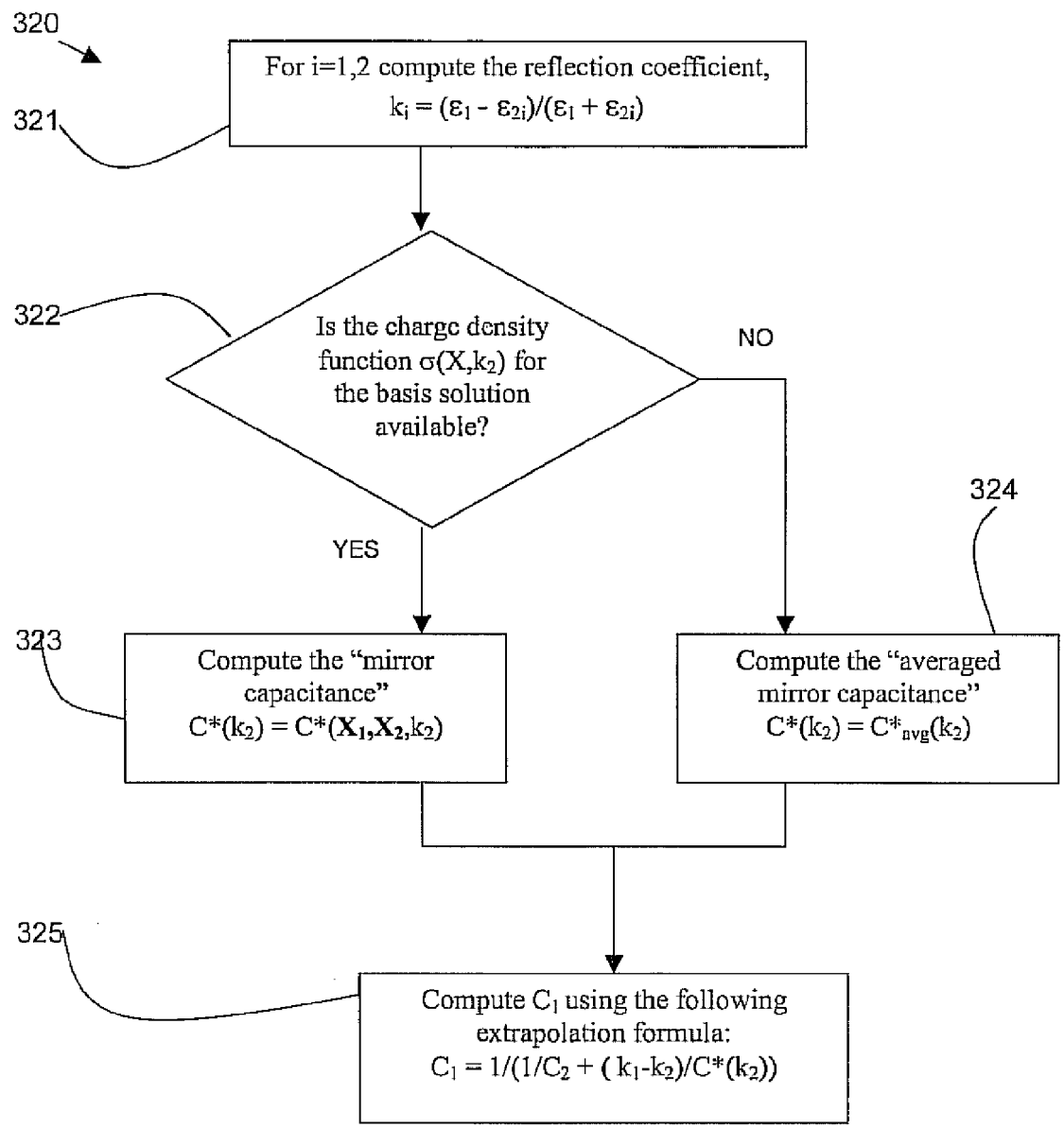

Referring to FIGS. 3A to 3C, flow diagrams 300, 310, 320 are shown of the implementation steps of the method.

In FIG. 3A, a flow diagram 300 is shown of the overall method of modeling capacitance in which a subject structure is provided 301 for which the capacitance is to be modelled. The subject structure has a pair of long conductors surrounded by a dielectric material and supported by a substrate. A basis structure is also provided 302 which has the same cross-sectional geometry as the subject structure.

It is assumed 303 that the surrounding dielectric material is a first dielectric with a first permittivity and the substrate is a second dielectric with a second permittivity. At very high frequencies a conductive substrate behaves as a dielectric resulting in this assumption. The first permittivity does not depend on frequency and the second permittivity does depend on frequency. The basis structure has the same first permittivity and a different second permittivity as the subject structure.

At the next step in the flow diagram, the known capacitance is computed 304 for the basis structure. This may be done by using, for example, one of an Electro-Magnetic solver, an analytical formula, a quasi-analytical formula, or look-up tables.

The capacitance for the subject structure can then be modelled 305 for the values of the first and second permittivity based on the known capacitance computed for the basis structure with the same first permittivity and a different second permittivity. The modeling can be carried out using an extrapolation or interpolation formula.

In FIG. 3B, a flow diagram 310 is shown of a method of modeling capacitance with the same initial steps 301, 302, 303 as shown in FIG. 3A. The steps of computing the known capacitance for the basis structure and modeling the capacitance for the subject structure are provided in more detail. At step 314 of FIG. 3B, the reflection coefficients for the subject structure and the basis structure are determined. The mirror capacitance for the basis structure is then determined 315 and the capacitance of the subject structure is computed 316 based on the reflection coefficients and the mirror capacitance.

The steps 314, 315, 316 are shown in more detail in the flow diagram 320 of FIG. 3C.

Referring to FIG. 3C, firstly, the following denotations are defined:

$C_1$=the capacitance for the subject solution;
$C_2$=the capacitance for the basis solution;
$\epsilon_{21}$=the substrate permittivity $\epsilon_2$ of the subject solution; and
$\epsilon_{22}$=the substrate permittivity $\epsilon_2$ of the basis solution.

At the first step 321 of the flow diagram 320, for i=1,2 compute the reflection coefficient, $k_i=(\epsilon_1-\epsilon_{2i})/(\epsilon_1+\epsilon_{2i})$. Next, it is determined 322 if the charge density function $\sigma(X,k_2)$ for the basis solution is available. If it is available, compute 323 the "mirror capacitance" $C^*(k_2)=C^*(X_1,X_2,k_2)$ which is fully defined by $\sigma(X,k_2)$. If the charge density function for the basis solution is not available, compute 324 the "averaged mirror capacitance" $C^*(k_2)=C^*_{avg}(k_2)$ based on the uniform charge density approximation. Computation of both $C^*(X_1,X_2, k_2)$ and $C^*_{avg}(k_2)$ is explained above.

In the final step 325, compute $C_1$ using the following extrapolation formula:

$$C_1=1/(1/C_2+(k_1-k_2)/C^*(k_2))$$

A similar implementation based on interpolation formula can be used which needs no less than two basis solutions.

The proposed approach for high frequency capacitance calculation of on-chip coplanar transmission lines over a substrate can be incorporated into CAD packages for interconnect-aware design and modeling. The approach is free from convergence difficulties and yields expressions which are easy to implement as a computer program. The final explicit semi-analytical expressions are easy to compute, do not contain any fitting parameters and yield reasonable accuracy.

Figure 4:
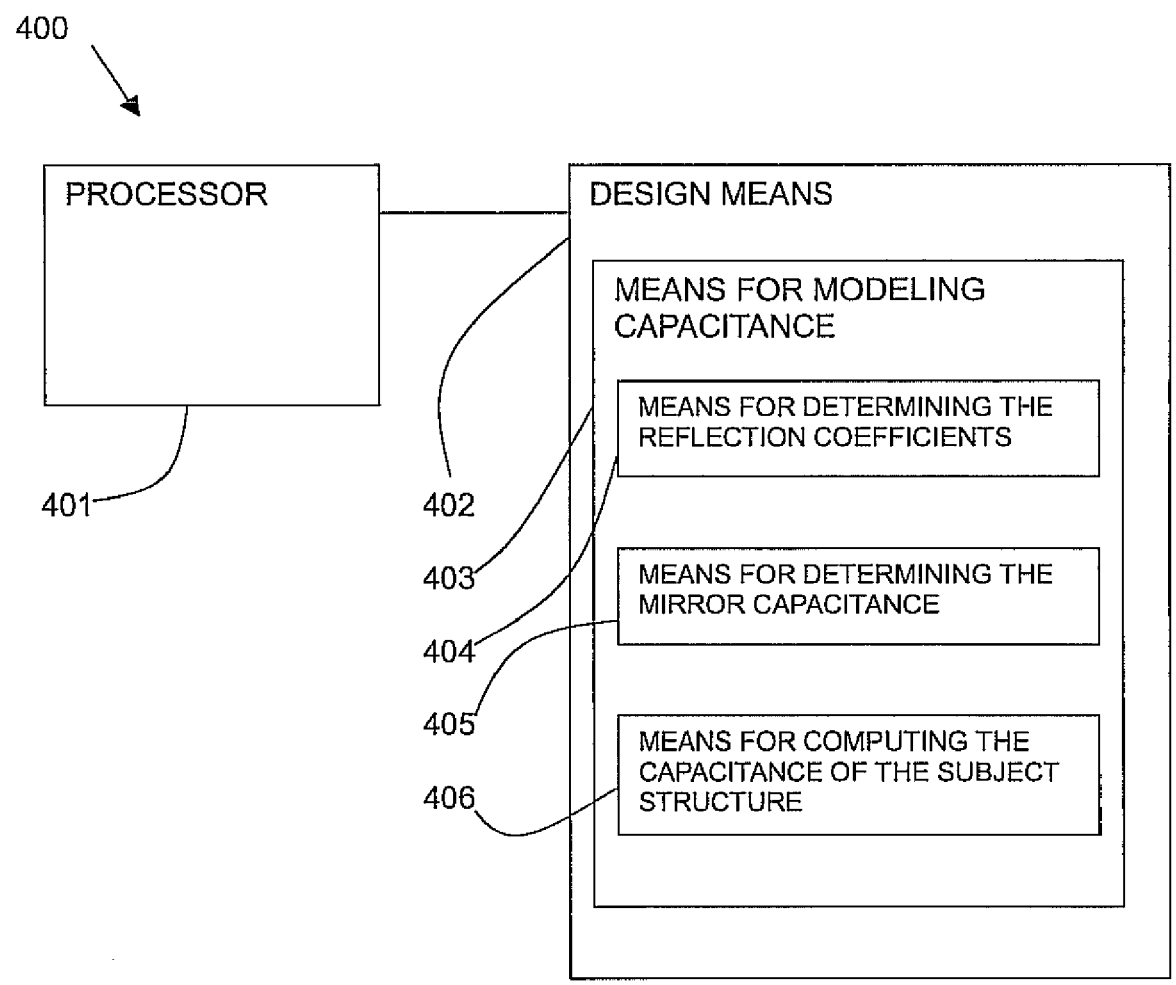
FIG. 4 is a schematic representation of an integrated circuit design system for implementing a design process including modeling capacitance in accordance with the present invention.

Referring to FIG. 4, a schematic representation of an integrated circuit design system 400 is shown. The system includes a design means 402 which may be implemented by specialized CAD software running on a computer indicated in the figure by a processor 401. The computer provides an interface with a designer.

The design means 402 includes means for modeling capacitance 403 for carrying out the steps of the described method which may be in the form of a computer program product. The means for modeling capacitance 403 includes means for determining 404 the reflection coefficients of the subject and basis structure, means for determining 405 the mirror capacitance of the basis structure and means for computing 406 the capacitance of the subject structure.

The present invention is typically implemented as a computer program product, comprising a set of program instructions for controlling a computer or similar device. These instructions can be supplied preloaded into a system or recorded on a storage medium such as a CD-ROM, or made available for downloading over a network such as the Internet or a mobile telephone network.

Improvements and modifications can be made to the foregoing without departing from the scope of the present invention.

We claim:

1. A method of modeling capacitance for a subject structure comprising a pair of long conductors surrounded by a dielectric material and supported by a substrate, wherein the capacitance of the conductors is a function of current frequency, wherein the method includes the steps of:

characterizing the surrounding dielectric material as a first dielectric with a first permittivity ($\epsilon_1$) and the substrate as a second dielectric with a second permittivity ($\epsilon_2$);

determining a reflection coefficient for the subject structure and a basis structure based on the first and second permittivities ($\epsilon_1, \epsilon_2$);

determining a minor capacitance for the basis structure; and computing a capacitance of the subject structure based on the reflection coefficients and the mirror capacitance.

2. A method as claimed in claim 1, wherein the minor capacitance is computed using a charge density function of the basis structure.

3. A method as claimed in claim 1, wherein the mirror capacitance is an averaged mirror capacitance based on a uniform charge density approximation for the basis structure.

4. A method as claimed in claim 1, wherein the method includes the following steps:

defining:
$C_1$ as the capacitance for the subject structure;
$C_2$ as the capacitance for the basis structure;
$\epsilon_{21}$ as the substrate permittivity $\epsilon_2$ of the subject structure; and
$\epsilon_{22}$ as the substrate permittivity $\epsilon_2$ of the basis structure;

determining the reflection coefficient, $k_i=(\epsilon_1-\epsilon_{2i})/(\epsilon_1+\epsilon_{2i})$ for i=1,2;

determining if a charge density function $\sigma(X,k_2)$ for a basis solution is available, if it is available, computing the mirror capacitance $C^*(k_2)=C^*(X_1,X_2,k_2)$ which is fully defined by $\sigma(X,k_2)$, and if the charge density function for the basis solution is not available, computing the averaged mirror capacitance $C^*(k_2)=C^*_{avg}(k_2)$ based on the uniform charge density approximation; and computing the capacitance $C_1$ using an extrapolation formula:

$$C_1=1/(1/C_2+(k_1-k_2)/C^*(k_2)).$$

5. The method as claimed in claim 1, wherein the surrounding dielectric material is an insulating material and the substrate behaves as a conductor at low frequencies and as a dielectric at very high frequencies.

6. The method as claimed in claim 1, wherein the dielectric is an oxide dielectric and the substrate is a silicon substrate.

7. The method as claimed in claim 1, wherein the pair of long conductors each have a width and metal layer thickness of the same order.

8. The method as claimed in claim 1, wherein the pair of long conductors are spaced apart by a distance of the same order as the width and thickness of the conductors.

9. The method as claimed in claim 1, wherein the cross-section of each of the long conductors is constant along the length.

10. The method as claimed in claim 1, wherein each of the long conductors is formed of a single conductor or more than one parallel conductor.

11. An integrated circuit design system for modeling a capacitance for a subject structure comprising a pair of long conductors surrounded by a dielectric material and supported by substrate, the surrounding dielectric material is a first dielectric with a first permittivity ($\epsilon_1$) and the substrate is a second dielectric with a second permittivity ($\epsilon_2$), the system comprising:

a memory storage device; and a processor storage device connected to the memory storage device, and adopted for performing a method comprising:

determining a reflection coefficient for the subject structure and a basis structure based on the first and second permittivities ($\epsilon_1$, $\epsilon_2$) of the subject structure and the basis structure;

determining a mirror capacitance for the basis structure; and computing the capacitance of the subject structure based on the reflection coefficients and the mirror capacitance.

12. The integrated circuit design system as claimed in claim 11, said method further comprising:

determining the reflection coefficient according to $k_i=(\epsilon_1-\epsilon_{2i})/(\epsilon_1+\epsilon_{2i})$ for i=1,2;

determining if a charge density function $\sigma(X,k_2)$ for a basis solution is available, and if said basis solution is available, computing the "minor capacitance" $C^*(k_2)=C^*(X_1,X_2,k_2)$ which is fully defined by $\sigma(X,k_2)$, and if the charge density function for the basis solution is not available, means for computing an "averaged minor capacitance" $C^*(k_2)=C^*_{avg}(k_2)$ based on a uniform charge density approximation; and computing a capacitance $C_1$ using an extrapolation formula:

$$C_1=1/(1/C_2+(k_1-k_2)/C^*(k_2));$$

wherein $C_1$ is the capacitance for the subject structure;
$C_2$ is the capacitance for the basis structure;
$\epsilon_{21}$ is the substrate permittivity $\epsilon_2$ of the subject structure; and
$\epsilon_{22}$ is the substrate permittivity $\epsilon_2$ of the basis structure.

13. The integrated circuit design system as claimed in claim 11, wherein the surrounding dielectric material is an insulating material and the substrate behaves as a conductor at low frequencies and as a dielectric at very high frequencies.

14. The integrated circuit design system as claimed in claim 11, wherein the dielectric is an oxide dielectric and the substrate is a silicon substrate.

15. The integrated circuit design system as claimed in claim 11, wherein the pair of long conductors each have a width and metal layer thickness of the same order.

16. The integrated circuit design system as claimed in claim 11, wherein the pair of long conductors are spaced apart by a distance of the same order as the width and thickness of the conductors.

17. The integrated circuit design system as claimed in claim 11, wherein the cross-section of each of the long conductors is constant along the length.

18. The integrated circuit design system as claimed in claim 11, wherein each of the long conductors is formed of a single conductor or more than one parallel conductor.

19. A computer program product stored on a computer readable storage medium readable by a processing circuit and storing instructions run by the processing circuit for performing a method for modeling capacitance for a subject structure comprising a pair of long conductors surrounded by a dielectric material and supported by a substrate, the surrounding dielectric material is a first dielectric with a first permittivity ($\epsilon_1$) and the substrate is a second dielectric with a second permittivity ($\epsilon_2$), said modeling method comprising:

determining a reflection coefficient for the subject structure and a basis structure based on the first and second permittivities ($\epsilon_1$, $\epsilon_2$);

determining a minor capacitance for the basis structure; and computing a capacitance of the subject structure based on the reflection coefficients and the mirror capacitance.

20. The computer program product as claimed in claim 19, said method further comprising:

determining the reflection coefficient, $k_i=(\epsilon_1-\epsilon_{2i})/(\epsilon_1+\epsilon_{2i})$ for i=1,2;

determining if a charge density function $\sigma(X,k_2)$ for the basis solution is available, if it is available, computing the "mirror capacitance" $C^*(k_2)=C^*(X_1,X_2,k_2)$ which is fully defined by $\sigma(X,k_2)$, and if the charge density function for the basis solution is not available, computing an "averaged mirror capacitance" $C^*(k_2)=C^*_{avg}(k_2)$ based on a uniform charge density approximation; and computing a capacitance $C_1$ using an extrapolation formula:

$$C_1=1/(1/C_2+(k_1-k_2)/C^*(k_2));$$

wherein $C_1$ is the capacitance for the subject structure;
$C_2$ is the capacitance for the basis structure;
$\epsilon_{21}$ is the substrate permittivity $\epsilon_2$ of the subject structure; and
$\epsilon_{22}$ is the substrate permittivity $\epsilon_2$ of the basis structure.

* * * * *